United States Patent
Kroener et al.

(10) Patent No.: US 10,373,839 B2
(45) Date of Patent: Aug. 6, 2019

(54) WAFER CONTACTING DEVICE, AND ARRANGEMENT AND METHOD FOR ELECTROCHEMICAL ETCHING OF A WAFER

(71) Applicant: Infineon Technologies AG, Neubiberg (DE)

(72) Inventors: Friedrich Kroener, Villach (AT); Ingo Muri, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1458 days.

(21) Appl. No.: 14/023,577

(22) Filed: Sep. 11, 2013

(65) Prior Publication Data

US 2015/0068918 A1    Mar. 12, 2015

(51) Int. Cl.
*H01L 21/3063* (2006.01)
*H01L 21/67* (2006.01)

(52) U.S. Cl.
CPC .... *H01L 21/3063* (2013.01); *H01L 21/67075* (2013.01); *H01L 21/67086* (2013.01)

(58) Field of Classification Search
CPC . C25B 7/12; C25B 7/123; C25B 7/126; C25F 3/12; C25F 3/30; H01L 21/673; H01L 21/67303; H01L 21/67313; H01L 21/67326; H01L 21/67075; H01L 21/67086

See application file for complete search history.

(56) References Cited

U.S. PATENT DOCUMENTS

| | | | | |
|---|---|---|---|---|
| 3,560,357 A | * | 2/1971 | Shaw | C25F 3/08 205/665 |
| 4,664,762 A | * | 5/1987 | Hirata | H01L 21/3063 205/157 |
| 2010/0210091 A1 | | 8/2010 | Mauder | |
| 2010/0264035 A1 | * | 10/2010 | Basol | C25D 5/02 205/122 |
| 2011/0278162 A1 | * | 11/2011 | Fredenberg | C25D 17/06 204/297.14 |
| 2012/0305404 A1 | * | 12/2012 | Keigler | H01L 21/67057 205/96 |

* cited by examiner

*Primary Examiner* — Ciel P Thomas
(74) *Attorney, Agent, or Firm* — Viering, Jentschura & Partner MBB

(57) ABSTRACT

A wafer contacting device may include: a receiving region configured to receive a wafer; and an elastically deformable carrier disposed in the receiving region and including an electrically conductive surface region.

22 Claims, 4 Drawing Sheets

FIG 3

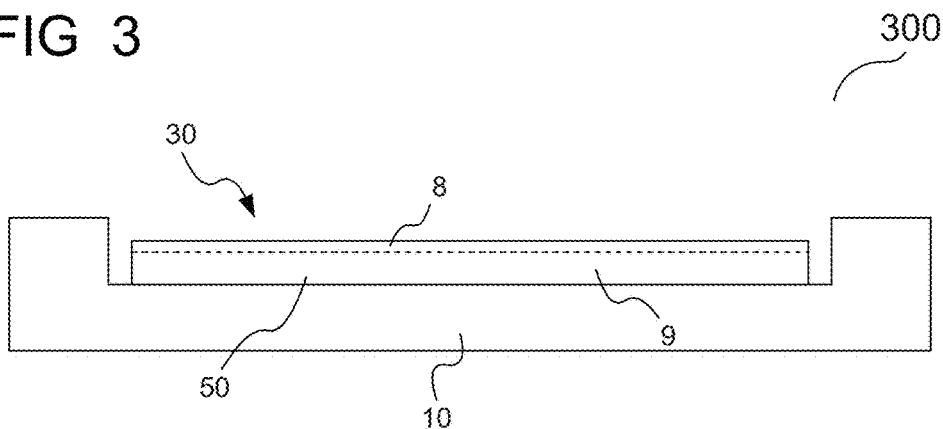

FIG 7

```
Provide a wafer having a first side and a second side opposite
the first side, the wafer including a stack including at least a
first semiconductor region of a first conductivity type and a
second semiconductor region of a second conductivity type
disposed adjacent to the first semiconductor region, wherein
the first semiconductor region is proximate the first side and
the second semiconductor region is proximate the second side
of the wafer, wherein the first and second semiconductor
regions include at least one power semiconductor device
```
— 702

```
Expose a first portion of the second side to an electrolyte
```
— 704

```
Couple a first electrical potential to the first side
```
— 706

```
Couple a second electrical potential to the electrolyte
```
— 708

```
Couple a third electrical potential to a second portion of the
second side that is not exposed to the electrolyte, the third
electrical potential being lower than the second electrical
potential and the second electrical potential being lower than
the first electrical potential
```
— 710

US 10,373,839 B2

WAFER CONTACTING DEVICE, AND ARRANGEMENT AND METHOD FOR ELECTROCHEMICAL ETCHING OF A WAFER

TECHNICAL FIELD

Various embodiments relate to a wafer contacting device, an arrangement for electrochemical etching of a wafer, and a method for electrochemical etching of a wafer.

BACKGROUND

Electrochemical etching is an etching process that involves the use of a solution of an electrolyte, an anode and a cathode. In electrochemical etching, so-called electrochemical etch-stop (ECES) or pn etching may be used to achieve precise thinning of wafers. ECES is based on the effect that an electrochemical etch process may stop at a space charge zone of a reverse-biased pn junction.

Conventional ECES processes and devices may have limited degrees of freedom with respect to a wafer layout that can be used with the respective process. It may be desirable to provide a process and a device that allow for overcoming or at least substantially reducing at least some of the limitations of the conventional processes or devices.

SUMMARY

A wafer contacting device in accordance with various embodiments may include: a receiving region configured to receive a wafer; and an elastically deformable carrier disposed in the receiving region and including an electrically conductive surface region.

An arrangement for electrochemical etching of a wafer in accordance with various embodiments may include: a wafer contacting device, including: a holder including a receiving region configured to receive a wafer, an elastically deformable carrier disposed in the receiving region and including an electrically conductive surface region, and a retainer placed over the holder; a wafer disposed over the elastically deformable carrier in the receiving region and retained by the retainer, wherein the electrically conductive surface region is in contact with at least a portion of a first side of the wafer; an electrolyte in contact with at least a portion of a second side of the wafer opposite the first side; at least one voltage source coupled to the electrically conductive surface region of the carrier and to the electrolyte, and configured to apply a first electrical potential to the electrically conductive surface region and to apply a second electrical potential to the electrolyte.

A method for electrochemical etching of a wafer in accordance with various embodiments may include: disposing a wafer over an elastically deformable carrier including an electrically conductive surface region, at least a portion of a first side of the wafer being coupled to the electrically conductive surface region of the carrier, the wafer including a stack including at least a first semiconductor region of a first conductivity type and a second semiconductor region of a second conductivity type disposed adjacent to the first semiconductor region, wherein the first semiconductor region is proximate the first side of the wafer and the second semiconductor region is proximate a second side of the wafer that is opposite the first side; coupling a first electrical potential to the electrically conductive surface region of the elastically deformable carrier; exposing at least a portion of the second side of the wafer to an electrolyte; and coupling a second electrical potential to the electrolyte, wherein the second electrical potential is lower than the first electrical potential.

A method for electrochemical etching of a wafer in accordance with various embodiments may include: providing a wafer having a first side and a second side opposite the first side, the wafer including a stack including at least a first semiconductor region of a first conductivity type and a second semiconductor region of a second conductivity type disposed adjacent to the first semiconductor region, wherein the first semiconductor region is proximate the first side and the second semiconductor region is proximate the second side of the wafer, wherein the first and second semiconductor regions include at least one power semiconductor device; exposing a first portion of the second side of the wafer to an electrolyte; coupling a first electrical potential to the first side of the wafer; coupling a second electrical potential to the electrolyte; and coupling a third electrical potential to a second portion of the second side that is not exposed to the electrolyte, wherein the third electrical potential is lower than the second electrical potential and the second electrical potential is lower than the first electrical potential.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3 shows a wafer contacting device according to various embodiments;

FIG. 7 shows a method for electrochemical etching of a wafer according to various embodiments.

DESCRIPTION

Figure 1:
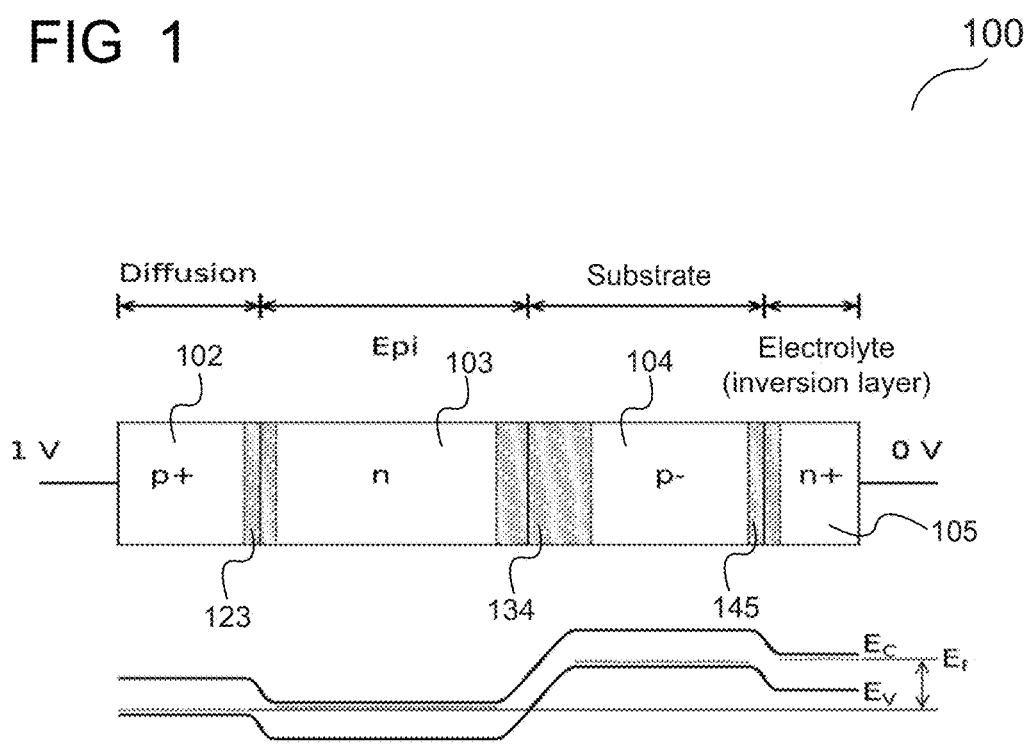
FIG. 1 shows a circuit diagram of a parasitic thyristor and a corresponding band diagram corresponding to a pn etching process with floating potential at a substrate.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

Any embodiment or design described herein is not necessarily to be construed as preferred or advantageous over other embodiments or designs.

The terms "at least one" and "one or more" may be understood to include any integer number greater than or equal to one, i.e. one, two, three, four, etc.

The term "a plurality" may be understood to include any integer number greater than or equal to two, i.e. two, three, four, five, etc.

The word "over", used herein to describe forming a feature, e.g. a layer, "over" a side or surface, may be used to mean that the feature, e.g. the layer, may be formed "directly on", e.g. in direct contact with, the implied side or surface. The word "over", used herein to describe forming a feature, e.g. a layer, "over" a side or surface, may be used to mean that the feature, e.g. the layer, may be formed "indirectly on" the implied side or surface with one or more additional layers being arranged between the implied side or surface and the formed layer.

Directional terminology, such as e.g. "upper", "lower", "top", "bottom", "left-hand", "right-hand", etc., may be used with reference to the orientation of figure(s) being described. Because components of the figure(s) may be positioned in a number of different orientations, the directional terminology is used for purposes of illustration and is in no way limiting. It is to be understood that structural or logical changes may be made without departing from the scope of the invention.

Various embodiments relate to the technical field of electrochemical etch-stop (ECES), also referred to as pn etching, on semiconductor wafers. ECES has the property that in an electrochemical cell, in which 1) an n-type semiconductor layer is coupled to the positive pole (positive terminal), 2) an underlying p-type semiconductor layer forms the contact with a hot alkaline electrolyte, and 3) a counter electrode (e.g. including or being made of a metal, e.g. platinum, or the like) is present, which forms the negative (minus) pole of the electrochemical cell, the etching may stop precisely at the space charge zone of the reverse-biased pn junction. Thus, it may be possible to thin a semiconductor having an initial thickness of several hundred microns with a precision that is practically identical to the precision of an epitaxial layer or implanted n-layer and that does not depend on an accuracy of the equipment. Thus, thinning of, e.g., power semiconductor wafers down to a single-digit number of microns (μm) and a total thickness variation (TTV) of some tens of a micron (μm) may be technically feasible.

The term "semiconductor" as used herein in expressions such as "semiconductor wafer", "semiconductor region", "semiconductor layer", etc, may include any elementary or compound semiconductor materials such as, e.g., silicon (Si), germanium (Ge), silicon carbide (SiC), silicon germanium (SiGe), gallium arsenide (GaAs), indium phosphide (InP), indium gallium arsenide (InGaAs), to name a few. In one or more embodiments, the term "semiconductor" may refer to silicon.

In mass production, ECES may be used for manufacturing of membranes, e.g. for pressure sensors. In previous applications, at least two photo levels (e.g. photo masks) may be needed to explicitly connect the n-type diffusion or epitaxial (epi) region at the wafer front side, but also to bring the p-type region, which is to be removed (etched), to a defined potential during the etching. Explicitly connecting the semiconductor (e.g. silicon) region, which is to be removed (etched), may enhance precision since effects caused by a lateral resistance between contact sites at the wafer boundary and the wafer center may be reduced. Said connections, though, may require effort and reduce the area available for integration of chips.

For a precise thinning of power semiconductors (e.g. power transistors) it may also be possible to connect the n-type region, e.g. the active semiconductor (e.g. silicon) region of the power transistors, indirectly via the p-type bodies (p-type body regions) of the source contacts without the need for separate contact structures. In this case, the reverse current of the pn junction, at which the etching will stop later, may flow via the forward biased pn junction between p-body and drift zone coupled in series. In this case, the p-region to be etched may be left floating since the additional effort for an electrical connection thereof merely for the purpose of carrying out a process may be inefficient from, e.g., an economic point of view. This process, however, may only work properly when the active n-region of the chips is delimited towards the bottom side with a very highly n-doped buried layer since holes that arrive from the p-bodies may then recombine reliably in the buried layer.

The aforementioned process, however, may not work for doping conditions of IGBTs (insulated-gate bipolar transistors) since in this case the layer sequence of p-body, n-drift zone, p-substrate and electrolyte (the electrolyte may be assumed as a highly n-doped region in order to apply the transistor theory) may represent a thyristor, which may latch already at a relatively low voltage of, e.g., about 0.4 volts across and thus immediately pull up the p-region to be etched to the positive potential of the electrochemical cell. In this case, the etching may end since the hydroxyl groups in the base may electrochemically oxidize the semiconductor (e.g. silicon) surface. The low breakthrough voltage of said parasitic thyristor may occur particularly in the case when the p-substrate is doped only in the kωxcm (kilo-ohms times centimeter) range such that it can be used for proton doping.

Figure 2:
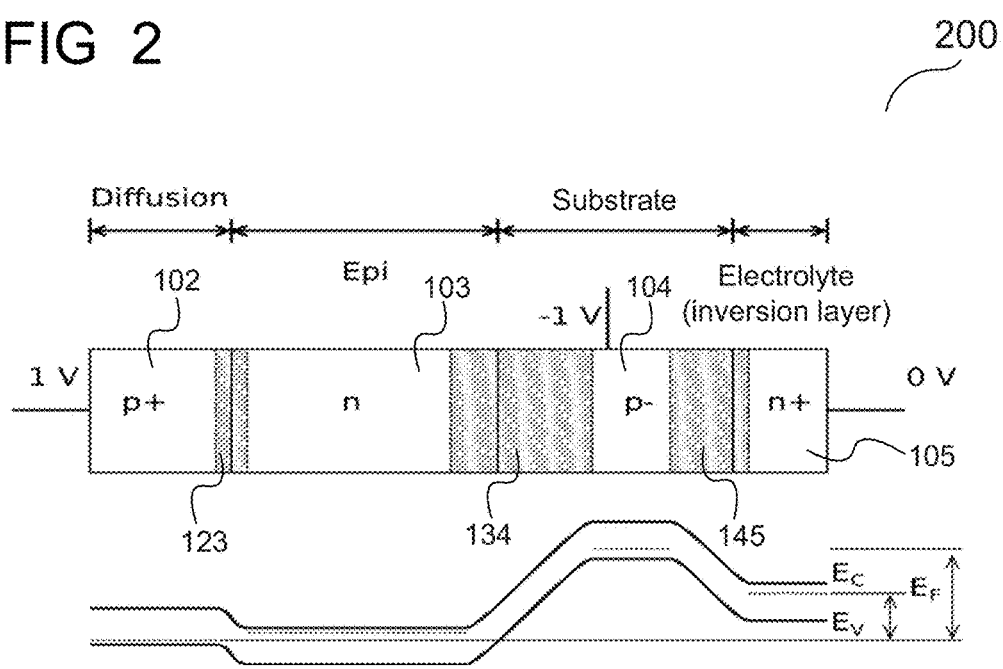
FIG. 2 shows a circuit diagram of a parasitic thyristor and a corresponding band diagram corresponding to a pn etching process with negative bias potential at the substrate.

FIG. 1 and FIG. 2 illustrate the aforementioned problem of the parasitic thyristor.

FIG. 1 and FIG. 2 show, in a view 100 and a view 200, respectively, a pnpn sequence of a p+ doped body 102, an n doped drift zone 103 (which may, e.g., include or be formed by an epitaxial layer, as shown), a p− doped substrate 104, and an electrolyte 105 (assumed as n+ doped region), and a corresponding band diagram (including energy level $E_V$ of the valence band upper edge, energy level $E_C$ of the conduction band lower edge, and Fermi energy level $E_F$).

FIG. 1 shows space charge zones 123, 134, and 145 located at the pn junctions, and the band diagram for the case that the p-substrate 104 to be etched is floating (with p+ body 102 biased with 1 V, and electrolyte 105 biased with 0 V), while FIG. 2 shows the space charge zones 123, 134, and 145 and the band diagram for the case that the p-substrate 104 to be etched is coupled to a negative potential (−1V in the example shown).

The aforementioned problem of the parasitic thyristor may, in principle, be circumvented by contacting a drain ring around each chip to the substrate and connecting all the drain rings to a grid, which is electrically connected at the wafer boundary for the etching.

However, this may then again require an additional photo level (e.g. photo mask) and additional area at the wafer boundary. Furthermore, it may be difficult or even impossible to pattern the metallization level of IGBTs using steppers. In addition, further photo levels may need to be adapted to the new situation in order to avoid p-doping in the contact trenches. Also, due to the lateral resistance of the active n-region, it may be necessary in the case of IGBTs and flyback diodes to implement the substrate contact as encircling the whole chip. In other words, a point contact may not be sufficient.

It may be desirable to overcome, reduce or avoid at least some of the aforementioned problems.

Various embodiments provide a device and a process that allow for an electrochemical etch-stop (ECES) for wafers of, e.g., power semiconductors, e.g. power transistors, without limiting degrees of freedom with respect to the layout.

Various embodiments allow for carrying out an ECES at a semiconductor device or product (e.g. a power semiconductor device, e.g. a power diode or power transistor, e.g. a power FET (field effect transistor) or IGBT) without having to apply additional lithographic processing or photo levels.

Various embodiments provide a way of how to contact a wafer so as to provide, for example, a negative biasing of a substrate or substrate region of the wafer, without the need for dedicated diffusion and/or metallization structures (e.g. drain rings and grid), on the wafer.

Various embodiments provide a process and a device for a layout-independent electrochemical etch stop.

Various embodiments allow for simultaneous contacting of a plurality of contact areas (e.g. pads, e.g. source pads) of a wafer without having to know or determine the positions of the contact areas on the wafer. In one or more embodiments, each contact area of the wafer may correspond to or be provided for a respective semiconductor chip of a plurality of semiconductor chips that may be included in the wafer.

In one or more embodiments, a self-aligning contacting device for carrying out an electrochemical etch stop at a wafer, in other words, for carrying out pn etching at the wafer, e.g. a semiconductor wafer, e.g. a silicon wafer, e.g. a wafer including one or more power devices (e.g. power transistors, e.g. power FETs or IGBTs, e.g. power diodes, e.g. flyback diodes), may be provided.

Various embodiments make use of an elastically deformable carrier having an electrically conductive surface region to contact a plurality of metallization regions (e.g. pads) at a side of a wafer that will not be etched by an electrochemical etch process, for example at a front side of the wafer.

FIG. 3 shows, as a cross-sectional view 300, a wafer contacting device according to various embodiments.

The wafer contacting device includes a receiving region 30 configured to receive a wafer. In other words, a wafer may be received at least partially, e.g. completely, in or by the receiving region.

The wafer contacting device further includes an elastically deformable carrier 50 disposed in the receiving region 30. The carrier 50 includes an electrically conductive surface region 8.

In one or more embodiments, the electrically conductive surface region 8 may include or may be an electrically conductive layer.

In one or more embodiments, the electrically conductive surface region 8 may contain or may be composed of a metal or a metal alloy.

In one or more embodiments, the electrically conductive surface region 8 may include or may be a metallic foil.

In one or more embodiments, the electrically conductive surface region 8 (e.g. electrically conductive layer, e.g. metallic foil) may be a thin region (e.g. thin layer, e.g. thin metallic foil), e.g. having a thickness of less than or equal to about 20 µm, although other values may be possible as well.

In one or more embodiments, the elastically deformable carrier 50 may include an electrically insulating base region 9, wherein the electrically conductive surface region 8 may be disposed over the base region 9, as shown in FIG. 3.

In one or more embodiments, the electrically insulating base region 9 may include or may be an electrically insulating layer.

In one or more embodiments, the electrically insulating base region 9 may contain or be composed of an elastically deformable plastic material.

In one or more embodiments, the electrically insulating base region 9 may contain or be composed of an elastic polymer (elastomer), e.g. a fluoroelastomer or perfluoroelastomer such as, e.g., hexafluoropropylene, or a silicone elastomer, or the like.

In one or more embodiments, the electrically insulating base region 9 may have a thickness in the range from about 500 µm to about 2 mm, although other values may be possible as well.

In one or more embodiments, the wafer contacting device may include a holder 10, for example a holder plate. The holder 10 may include the receiving region 30. For example, the receiving region 30 may be a recess in the holder 10.

In one or more embodiments, the carrier 50 (e.g. the electrically insulating base region 9) may be attached to the holder 10, for example to a bottom surface of the recess in the holder 10.

In one or more embodiments, the wafer contacting device may further include at least one voltage source (not shown, see e.g. FIG. 4) electrically coupled to the electrically conductive surface region 8 of the carrier 50.

In one or more embodiments, the wafer contacting device may include an electrical connection (not shown, see e.g. FIG. 4) connecting the at least one voltage source to the electrically conductive surface region 8. The electrical connection may, e.g., include at least one conductive line.

In one or more embodiments, the at least one voltage source may be configured to apply an electrical potential (herein also referred to as first electrical potential) to the electrically conductive surface region 8.

In one or more embodiments, the wafer contacting device may further include a retainer (not shown, see e.g. FIG. 4) configured to retain the wafer in the receiving region 30.

In one or more embodiments, the retainer may be configured to be placed over the holder 10.

In one or more embodiments, the retainer may have a ring-like shape.

In one or more embodiments, the electrically conductive surface region 8 of the carrier 50 may be configured to electrically contact a first side of the wafer.

In one or more embodiments, the first side may be a front side of the wafer.

For example, the electrically conductive surface region 8 may be configured to electrically contact one or more structures, e.g. one or more device or product structures, e.g. one or more pads (e.g. source pads), at the first side of the wafer.

In one or more embodiments, the wafer contacting device may be further configured to electrically contact a second side of the wafer that is opposite the first side.

In one or more embodiments, the second side may be a back side of the wafer.

In one or more embodiments, the retainer may include a contacting structure (not shown, see e.g. FIG. 4) configured to electrically contact the second side of the wafer that is opposite the first side.

In one or more embodiments, the contacting structure may include or may consist of an electrically conductive material, for example a metal or metal alloy.

In one or more embodiments, the contacting structure may be disposed at a side of the retainer that faces the receiving region, e.g. a side of the retainer that faces the holder including the receiving region.

In one or more embodiments, the contacting structure may be configured to electrically contact the second side of the wafer at a boundary region of the wafer, for example at a peripheral region of the wafer, for example at a circumferential region of the wafer.

In one or more embodiments, the contacting structure may include at least one spring configured to contact the second side of the wafer.

In one or more embodiments, the holder may include an electrical contact, and the contacting structure may be configured to electrically contact the electrical contact of the holder.

In one or more embodiments, the contacting structure may include at least one first spring configured to contact the second side of the wafer, and at least one second spring configured to contact the holder (e.g. the electrical contact of the holder).

In one or more embodiments, the contacting structure may be configured to be electrically coupled to the at least one voltage source, for example when the retainer is placed over the holder.

In one or more embodiments, the wafer contacting device may include an electrical connection (not shown, see e.g. FIG. 4) connecting the at least one voltage source to the electrical contact of the holder. The electrical connection may, e.g., include at least one conductive line.

In one or more embodiments, the at least one voltage source may be configured to be electrically coupled to the electrolyte. For example, the at least one voltage source may be configured to be coupled to an electrode (e.g. an electrode including or being made of a metal or metal alloy, e.g. a metal electrode, e.g. a platinum electrode) that may be coupled to (e.g. placed in) the electrolyte.

In one or more embodiments, the at least one voltage source may be configured to apply an electrical potential (herein also referred to as second electrical potential) to the electrolyte. The second electrical potential may be lower than the first electrical potential.

In one or more embodiments, the at least one voltage source may be configured to apply an electrical potential (herein also referred to as third electrical potential) to the contacting structure. The third electrical potential may be lower than the second electrical potential.

In one or more embodiments, the retainer may further include a sealing (not shown, see e.g. FIG. 4) configured to seal the boundary region and the contacting structure against an electrolyte.

In one or more embodiments, the sealing may be disposed (e.g. attached) at a side of the retainer that faces the receiving region, e.g. the side of the retainer that faces the holder including the receiving region.

A wafer contacting device such as the one shown in FIG. 3 may be used to electrically contact a wafer, for example in an electrochemical etch process that may be used to thin the wafer, as will be described in the following.

Figure 4:
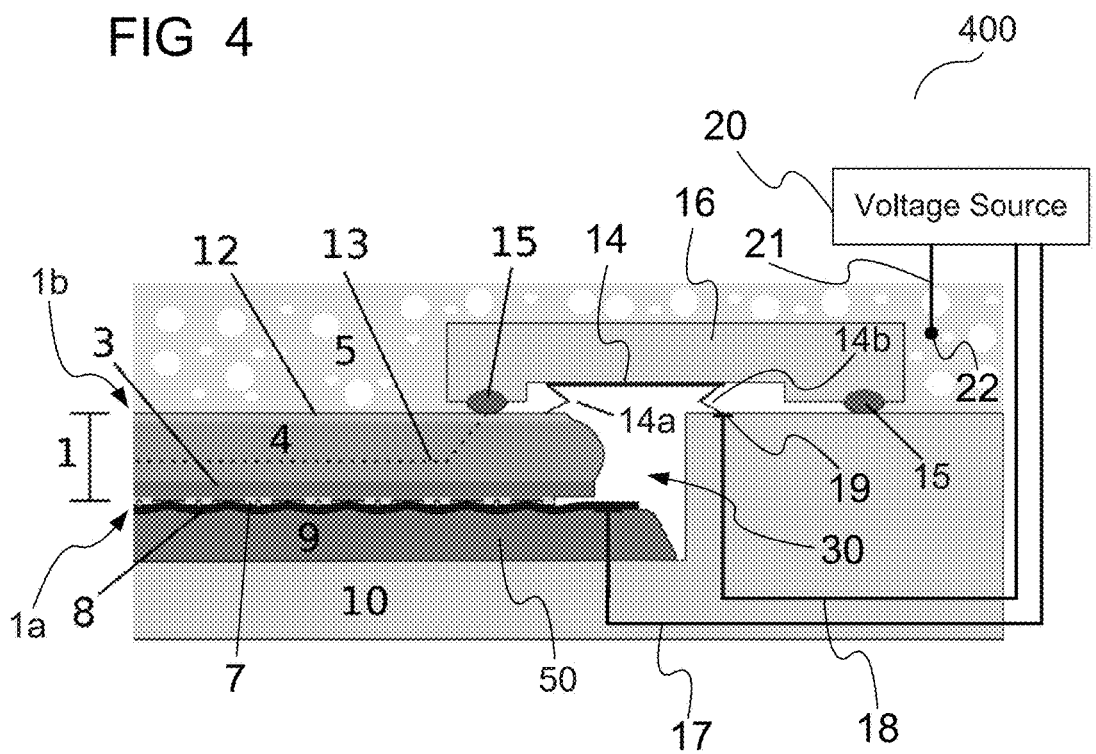
FIG. 4 shows an arrangement for electrochemical etching of a wafer according to various embodiments.
Figure 5:
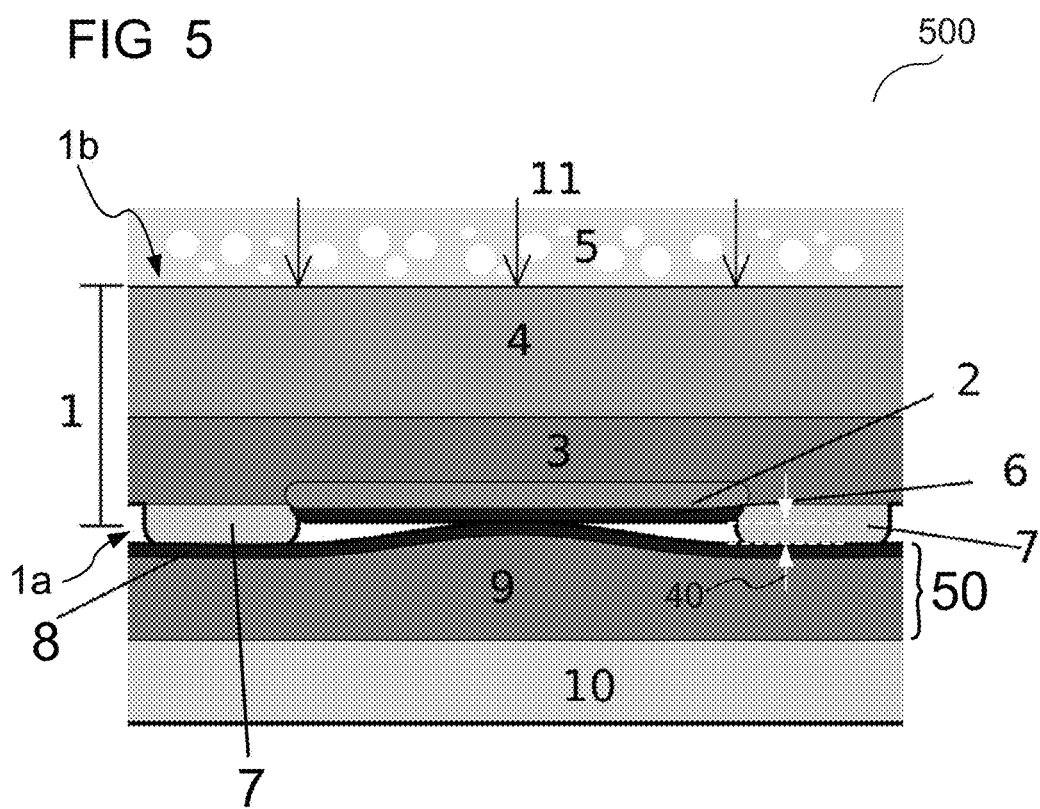
FIG. 5 shows an enlarged view of a section of FIG. 4.

FIG. 4 shows, as a view 400, an arrangement for electrochemical etching of a wafer according to one or more embodiments, and FIG. 5 shows an enlarged view 500 of a section of FIG. 4. Reference signs that are the same as in FIG. 3 denote the same or similar elements as there and will not be described in detail again here. Reference is made to the description above.

The arrangement includes a wafer contacting device, including a holder 10 including a receiving region 30 configured to receive a wafer 1, an elastically deformable carrier 50 disposed in the receiving region 30 and including an electrically conductive surface region 8, and a retainer 16 placed over the holder 10.

The arrangement further includes a wafer 1 disposed over the elastically deformable carrier 50 in the receiving region 30 and retained by the retainer 16. The electrically conductive surface region 8 is in contact with at least a portion of a first side 1a of the wafer 1.

The arrangement further includes an electrolyte 5 in contact with at least a portion of a second side 1b of the wafer 1 opposite the first side 1a.

In one or more embodiments, the first side 1a may be a front side of the wafer 1, and the second side 1b may be a back side of the wafer 1.

In one or more embodiments, the electrolyte 5 may be an alkaline electrolyte.

The arrangement further includes at least one voltage source 20 coupled to the electrically conductive surface region 8 of the carrier 50 and to the electrolyte 5, and configured to apply a first electrical potential to the electrically conductive surface region 8 and to apply a second electrical potential to the electrolyte 5.

In one or more embodiments, the arrangement may include an electrical connection 17 connecting the at least one voltage source 20 to the electrically conductive surface region 8 of the carrier 50. The electrical connection 17 may, e.g., include at least one conductive line.

In one or more embodiments, the holder may include a lead-through (not shown), and at least a portion of the electrical connection 17 (e.g. conductive line) may be disposed in the lead-through.

In one or more embodiments, the arrangement may include an electrical connection 21 coupling the at least one voltage source 20 to the electrolyte 5. The electrical connection 21 may, e.g., be coupled to an electrode 22 (e.g. an electrode including or being made of a metal or metal alloy, e.g. a metal electrode, e.g. a platinum electrode) that may be coupled to (e.g. placed in) the electrolyte 5. The electrical connection 21 may, e.g., include at least one conductive line.

In one or more embodiments, the retainer 16 may have a ring-like shape. In this case, the retainer 16 may also be referred to as a retainer ring. In this case, FIG. 4 may illustratively show a cross-section through the ring-like shaped retainer 16.

In one or more embodiments, the wafer 1 may include a stack including at least a first semiconductor region 3 of a first conductivity type and a second semiconductor region 4 of a second conductivity type disposed adjacent to the first semiconductor region 3. The first semiconductor region 3 may be proximate the first side 1a of the wafer 1 and the second semiconductor region 4 may be proximate the second side 1b of the wafer 1.

In one or more embodiments, the term "stack" may refer to a plurality of regions or layers disposed one over the other.

In one or more embodiments, the first semiconductor region 3 and the second semiconductor region 4 may be disposed directly adjacent to one another. That is, the first semiconductor region 3 and the second semiconductor region 4 may have a common interface.

In one or more embodiments, the first conductivity type and the second conductivity type may be different (e.g. opposite) conductivity types.

In one or more embodiments, the first conductivity type may be an n-type conductivity type and the second conductivity type may be a p-type conductivity type. In other words, the first conductivity type may refer to current conduction being at least substantially achieved by negative charge carriers (electrons), while the second conductivity type may refer to current conduction being at least substantially achieved by positive charge carriers (holes).

Thus, in one or more embodiments, the first semiconductor region 3 may be an n-type region, e.g. an n-doped layer, and the second semiconductor region 4 may be a p-type region, e.g. a p-doped layer.

In one or more embodiments, the second semiconductor region 4 may have a dopant concentration in the range from about $10^{13}$ cm$^{-3}$ to about $10^{17}$ cm$^{-3}$, e.g. a dopant concentration of about $10^{15}$ cm$^{-3}$, although other values may be possible as well.

In one or more embodiments, the first semiconductor region 3 may have a higher dopant concentration than the second semiconductor region 4.

In one or more embodiments, the first semiconductor region 3 may have a dopant concentration in the range from about $10^{14}$ cm$^{-3}$ to about $10^{19}$ cm$^{-3}$, e.g. a dopant concentration of about $10^{15}$ cm$^{-3}$, although other values may be possible as well.

In one or more embodiments, the wafer 1 may include one or more semiconductor devices, e.g. vertically integrated semiconductor devices, e.g. power semiconductor devices, e.g. power diodes or power transistors, e.g. power FETs or IGBTs, or the like.

In one or more embodiments, the one or more semiconductor devices, e.g. vertically integrated semiconductor devices, e.g. power semiconductor devices, e.g. power diodes or power transistors, e.g. power FETs or IGBTs, may be integrated at least partially in the first semiconductor region 3 (e.g. n-type region).

In one or more embodiments, the first semiconductor region 3 (e.g. n-type region) may include or may be an active region (or a part of an active region) of the wafer 1, for example an active region (or a part of an active region) of the one or more semiconductor devices, e.g. vertically integrated semiconductor devices, e.g. power semiconductor devices, e.g. power diodes or power transistors, e.g. power FETs or IGBTs, included in the wafer 1.

In one or more embodiments, the first semiconductor region 3 (e.g. n-type region) may include or may be a drift zone of the one or more semiconductor devices, e.g. vertically integrated semiconductor devices, e.g. power semiconductor devices, e.g. power diodes or power transistors, e.g. power FETs or IGBTs, included in the wafer 1.

In one or more embodiments, the second semiconductor region 4 (e.g. p-type region) may include or may be a substrate region or substrate of the wafer 1, for example a substrate region or substrate of the one or more semiconductor devices, e.g. vertically integrated semiconductor devices, e.g. power semiconductor devices, e.g. power diodes or power transistors, e.g. power FETs or IGBTs, included in the wafer 1.

In one or more embodiments, the second semiconductor region 4 (e.g. p-type region) may be a region, for example a substrate region or substrate (e.g. p-type substrate), to be thinned by an electrochemical etch process.

In one or more embodiments, the second semiconductor region 4 (e.g. p-type region, e.g. p-type substrate layer) may have a thickness of greater than or equal to about 100 nm, e.g. a thickness in the range from about 100 nm to about 700 µm, although other values may be possible as well.

In one or more embodiments, the first semiconductor region 3 (e.g. n-type region, e.g. n-doped layer) may include or may be an epitaxially grown layer.

In one or more embodiments, the first semiconductor region 3 (e.g. n-type region, e.g. n-doped layer) may have a thickness of less than or equal to about 180 µm, e.g. a thickness in the range from about 10 nm to about 180 µm, although other values may be possible as well.

In one or more embodiments, the second electrical potential (applied to the electrolyte 5) may be lower than the first electrical potential (applied to the electrically conductive surface region 8).

In one or more embodiments, the electrolyte 5 may be in contact (e.g. physical contact, e.g. direct physical contact) with at least a portion of the second side 1b of the wafer 1.

In one or more embodiments, the retainer 16 may include a contacting structure 14, which is in contact (e.g. physical contact, e.g. direct physical contact) with a portion of the second side 1b of the wafer 1.

In one or more embodiments, the contacting structure 14 may include or may consist of an electrically conductive material, for example a metal or metal alloy.

In one or more embodiments, the electrolyte 5 may be in contact with a first portion of the second side 1b of the wafer 1, and the contacting structure 14 may be in contact with a second portion of the second side 1b of the wafer 1. The first portion may, e.g., correspond to a central region of the wafer 1, while the second portion may, e.g., correspond to a boundary region or peripheral region of the wafer 1. The central region may, e.g., include or be a circular area of the wafer 1 centered around the wafer axis, while the boundary region may, e.g., include or be a ring-shaped area of the wafer 1 enclosing the circular area.

In one or more embodiments, the contacting structure 14 may be in contact with the second side 1b of the wafer 1 at the boundary region of the wafer 1, and the electrolyte 5 may be in contact with the second side 1b of the wafer 1 except at the boundary region of the wafer 1. In other words, the contacting structure 14 may contact the second side 1b of the wafer 1 at the boundary region of the wafer 1 where the electrolyte 5 does not contact the second side 1b of the wafer 1.

In one or more embodiments, the contacting structure 14 may include at least one first spring 14a that may be configured to contact the second side 1b of the wafer 1, for example the second portion of the second side 1b, for example at the boundary region or peripheral region of the wafer 1. In one or more embodiments, the contacting structure 14 may include at least one second spring 14b that may be configured to contact the holder 10, for example an electrical contact 19 of the holder 10, as shown. In one or more embodiments, the contacting structure 14 may include an electrical connection connecting the first spring 14a to the second spring 14b. In one or more embodiments, the connection may be a conductive line or may include at least one conductive line.

In one or more embodiments, the at least one voltage source 20 may be coupled to the electrical contact 19 of the holder 10. For example, the arrangement may include an electrical connection 18 connecting the at least one voltage source 20 to the electrical contact 19 of the holder 10. The electrical connection 18 may, e.g., include at least one conductive line.

In one or more embodiments, the holder 10 may include a lead-through (not shown), and at least a portion of the electrical connection 18 (e.g. conductive line) may be disposed in the lead-through.

In one or more embodiments, the at least one voltage source 20 may be coupled to the contacting structure 14 (e.g. via the electrical connection 18, the electrical contact 19 and the at least one second spring 14b) and configured to apply a third electrical potential to the contacting structure 14, and the third electrical potential may be lower than the second electrical potential.

In one or more embodiments, a potential difference (voltage) between the first electrical potential (applied to the electrically conductive surface region 8 of the carrier 50) and the second electrical potential (applied to the electrolyte 5) may be in the range from about 0.8 V to about 20 V, e.g. about +1 V, although other values may be possible as well.

In one or more embodiments, a potential difference (voltage) between the second electrical potential (applied to the electrolyte 5) and the third electrical potential (applied to the second side 1b of the wafer 1, e.g. to the second semiconductor region 4) may be in the range from about 0.2 V to about 1.2 V, e.g. about +1 V, although other values may be possible as well.

In one or more embodiments, the wafer 1 may further include at least one third semiconductor region 2 (see FIG. 5) of the second conductivity type (e.g. p-type conductivity type) disposed at the first side 1a of the wafer 1 at least partially within the first semiconductor region 3.

In one or more embodiments, the at least one third semiconductor region 2 may have a higher dopant concentration than the first semiconductor region 3.

In one or more embodiments, the at least one third semiconductor region 2 may have a dopant concentration in the range from about $10^{15}$ cm$^{-3}$ to about $10^{18}$ cm$^{-3}$, e.g. a dopant concentration of about $10^{16}$ cm$^{-3}$, although other values may be possible as well.

In one or more embodiments, the at least one third semiconductor region 2 may include at least one semiconductor device cell structure, e.g. at least one transistor cell structure (not shown).

In one or more embodiments, the at least one third semiconductor region 2 (e.g. p-type region) may include or may be at least one body region or diffusion region of the wafer 1, for example a body region or diffusion region of the one or more semiconductor devices, e.g. vertically integrated semiconductor devices, e.g. power semiconductor devices, e.g. power diodes or power transistors, e.g. power FETs or IGBTs, included in the wafer 1.

In one or more embodiments, the wafer 1 may further include at least one metallization region 6 disposed over a side of the at least one third semiconductor region 2 facing the elastically deformable carrier 50, as shown.

In one or more embodiments, the at least one metallization region 6 may be configured as a contact pad, e.g. a source pad, e.g. of the one or more semiconductor devices, e.g. vertically integrated semiconductor devices, e.g. power semiconductor devices, e.g. power diodes or power transistors, e.g. power FETs or IGBTs, included in the wafer 1.

In one or more embodiments, the at least one metallization region 6 may contain or may be composed of at least one of a metal and a metal alloy.

In one or more embodiments, each metallization region 6 (e.g. contact pad, e.g. source pad) may correspond to a respective one of a plurality of chips that may be included in the wafer.

In one or more embodiments, the wafer 1 may further include at least one insulating region 7 disposed laterally adjacent to the at least one metallization region 6, as shown.

In one or more embodiments, the at least one insulating region 7 may include at least one material selected from a group of materials, the group consisting of: an oxide, a nitride, an imide. However, other insulating materials may be possible as well.

In one or more embodiments, the at least one insulating region 7 may protrude from the first side 1a of the wafer 1. In other words, the at least one insulating region 7 may form at least one protrusion.

In one or more embodiments, the at least one insulating region 7 may project topographically beyond the at least one metallization region 6 disposed over the at least one third semiconductor region 2, as shown in FIG. 5.

For example, a vertical distance 40 (in other words, a height difference) between a side of the at least one insulating region 7 facing the carrier 50 and a side of the at least metallization region 6 facing the carrier 50 may be greater than or equal to about 4 μm, for example in the range from about 4 μm to about 20 μm, although other values may be possible as well. The term "vertical distance" may refer to a distance in a direction substantially perpendicular to a main processing surface of the wafer 1, e.g. a direction substantially perpendicular to the first side 1a and/or second side 1b of the wafer 1.

In one or more embodiments, the vertical distance 40 may be zero, or about zero, e.g. less than one or a few nanometers. In other words, the side of the at least one insulating region 7 facing the carrier 50 and the side of the at least metallization region 6 facing the carrier 50 may be flush or substantially flush.

In one or more embodiments, the wafer 1 may include a plurality of third semiconductor regions 2 of the second conductivity type disposed at the first side 1a of the wafer 1 at least partially within the first semiconductor region 3; and a plurality of electrically insulating regions 7 disposed laterally between the plurality of third semiconductor regions 2.

In one or more embodiments, the plurality of third semiconductor regions 2 may be coated with a respective plurality of metallization regions 6 (e.g. pads).

In one or more embodiments, the plurality of insulating regions 7 may protrude from the first side 1a of the wafer 1. For example, the plurality of insulating regions 7 may project vertically beyond the metallization regions 6 (e.g. pads), as shown in FIG. 4 and FIG. 5.

In one or more embodiments, the plurality of insulating regions 7 may laterally insulate the metallization regions 6 from one another.

As shown in FIG. 4 and FIG. 5, the elastically deformable carrier 50, more particularly the electrically conductive surface region 8 (e.g. metallic foil) thereof, may contact the plurality of metallization regions 6 (e.g. pads). For example, portions of the carrier 50 corresponding to locations of the metallization regions 6 may be bent towards the respective metallization regions 6 upon placing the wafer 1 over the carrier 50. This may allow for a reliable electrical contact of each metallization region 6 of the wafer 1 via the carrier 50 regardless of the metallization regions' locations on the wafer 1. In other words, the locations of the metallization regions 6 on the wafer 1 may not need to be known in advance in order to be able to contact them.

In one or more embodiments, the force used for deformation of the elastically deformable carrier 50 may be provided by, e.g., atmospheric pressure (indicated by arrows 11 in FIG. 5) and a prevacuum.

Illustratively, upon placing the wafer 1 over the elastically deformable carrier 50, the carrier 50 may deform or adapt its surface topography to the topography of the wafer 1, and the electrically conductive surface region 8 of the carrier 50 may contact the plurality of metallization regions 6 (e.g. pads). Having the first side 1a of the wafer 1 contacted in this way, an electrical potential (first electrical potential) may then be applied to the first side 1a of the wafer 1, more particularly to the metallization regions 6 (e.g. pads) in this example, for example to carry out electrochemical etching. In one or more embodiments, the deformation of the carrier 50 may be reversible. That is, in one or more embodiments the carrier 50 may reassume its original (undeformed) shape once the wafer 1 has been removed from the carrier 50. Thus, in one or more embodiments the carrier 50 may be used for successively contacting a plurality of wafers having, e.g., different configurations of metallization regions (e.g. pads).

In one or more embodiments, an electrically conductive layer 12 may be disposed at the second side (e.g. back side) 1b of the wafer 1, for example over the second semiconductor region 4, as shown. The electrically conductive layer 12 may be an auxiliary layer that may be applied to the wafer 1 before the etching starts. The electrically conductive layer 12 may form an ohmic contact to the second semiconductor region (e.g. p-type substrate) 4.

In one or more embodiments, the electrically conductive layer 12 may be disposed over substantially the entire area of the second side 1b of the wafer 1.

In one or more embodiments, the electrically conductive layer 12 may be a doped layer. For example, in one or more embodiments, the electrically conductive layer 12 may have been formed in the second semiconductor region 4 by means of dopant implantation, e.g. by means of p-type dopant implantation into a p-type second semiconductor region 4, for example including a subsequent anneal process (e.g. laser anneal, e.g. pulsed laser anneal).

In one or more embodiments, the dopant implantation may be configured such that the electrically conductive layer 12 has a higher dopant concentration than the second semiconductor region 4.

For example, in one or more embodiments the electrically conductive layer 12 may have a dopant concentration in the range from about $10^{18}$ cm$^{-3}$ to about $10^{19}$ cm$^{-3}$, although values may be possible as well.

Alternatively or in addition to a doped layer, the electrically conductive layer 12 may include or may be a metallic layer including a metal and/or metal alloy. For example, the electrically conductive layer 12 may include or may be a layer containing or being composed of aluminum (Al), titanium (Ti), nickel (Ni), or tungsten (W), or an alloy containing or consisting of one or more of the aforementioned metals, although other metals or metal alloys may be possible as well.

In one or more embodiments, at least a portion (e.g. a central portion) of the electrically conductive layer 12 may get in contact with (in other words, may be exposed to) the electrolyte 5 that is used in the electrochemical etching (pn etching).

In one or more embodiments, the portion of the electrically conductive layer 12 that gets in contact with the electrolyte 5 may be removed during the etching, in other words etched away, as is shown in FIG. 4, which schematically indicates as a dashed line 13 an etch front obtained after some time of etching, and as is shown in FIG. 5, which illustratively shows a processing stage, in which the electrically conductive layer 12 (or at least the portion, e.g. central portion, of the layer 12 that is exposed to the electrolyte 5) has already been etched away. Thus, the electrically conductive layer 12 may also be referred to as a sacrificial layer.

In one or more embodiments, the electrically conductive layer 12 at the second side 1b of the wafer 1 may have a thickness of less than or equal to about 2 μm, e.g. a thickness of less than or equal to about 0.5 μm, or a thickness in the range from about 0.1 μm to about 2 μm, although other values may be possible as well.

In one or more embodiments, the electrically conductive layer 12 at the second side 1b of the wafer 1 may be omitted (in other words, not provided). For example, in case that a dopant concentration of the second semiconductor region 4 (e.g. p-type substrate) (e.g. of a base material of the p-type substrate) is sufficiently high, the electrically conductive layer 12 may be omitted. If the electrically conductive layer 12 is not provided, the second semiconductor region 4 (e.g. p-type substrate) may be contacted directly, for example by the contacting structure 14 (e.g. by the at least one first spring contact 14a of the contacting structure 14) configured to contact the second side 1b of the wafer 1, see below. This may be favorable insofar as a resultant Schottky contact in the arrangement may be forward biased.

In one or more embodiments, the retainer 16 may include a sealing 15 that is configured to seal against the electrolyte 5 used in the electrochemical etching or pn etching.

In one or more embodiments, the sealing 15 may be disposed (e.g. attached) at a side of the retainer 16 facing the holder 10.

In one or more embodiments, the sealing 15 may be configured to seal the contacting structure 14 and/or the boundary region of the wafer 1 against the electrolyte 5.

In one or more embodiments, the sealing 15 may include or may be made of a sealing material such as, e.g., an elastomer, e.g. a fluoroelastomer or perfluoroelastomer such as, e.g., hexafluoropropylene, or the like.

In one or more embodiments, the sealing 15 may include or may be at least one ring, or may have a ring-like shape. In one or more embodiments, the sealing 15 may include a first ring (also referred to as inner ring) configured to mechanically contact the second side 1b of the wafer 1, for example at the peripheral or boundary region of the wafer 1, and a second ring (also referred to as outer ring) configured to mechanically contact the holder 10. The second ring may have a larger diameter than the first ring.

In one or more embodiments, the contacting device 14 (e.g. the first spring 14a) may be configured to contact the electrically conductive layer 12 (or the second semiconductor region 4 (e.g. p-type substrate), if the electrically conductive layer 12 is not provided) at the boundary region of the wafer (wafer boundary).

In one or more embodiments, the contacting structure 14 may be disposed between the first ring (inner ring) and the second ring (outer ring) of the sealing 15. Thus, the contacting structure 14 may contact the electrically conductive layer 12 (or the second semiconductor region 4 (e.g. p-type substrate)) at the wafer boundary outside the first ring (inner ring) of the sealing 15.

In one or more embodiments, the at least one voltage source 20 may be configured to apply a negative potential to the second semiconductor region 4 (e.g. p-type substrate) with respect to the first semiconductor region 3 (e.g. n-type region, e.g. active region) and the electrolyte 5. In other words, the voltage source 20 may be configured to apply a potential to the second semiconductor region 4 (e.g. p-type substrate) that is lower than a potential applied to the first semiconductor region 3 (e.g. n-type region) and lower than a potential applied to the electrolyte 5. In one or more embodiments, the potential applied to the electrolyte 5 may be lower than the potential applied to the first semiconductor region 3 (e.g. n-type region, e.g. active region). In one or more embodiments, the potentials applied to the first semiconductor region 3 (e.g. n-type region) and the electrolyte 5, respectively, may be provided by the voltage source 20 as well.

In accordance with one or more embodiments, the arrangement shown in FIG. 4 and FIG. 5 may include a wafer 1 (e.g. a silicon wafer) that includes a p-doped substrate 4, and a p-type region 2 formed by means of thermal in-diffusion in an n-type epitaxial region 3. The p-doped substrate 4 may be etched using an alkaline electrolyte 5. Structures for transistor cells may be disposed in and/or on the p-type region 2 (not shown). For the source connections a metallization 6 may be applied for each chip, and for the lateral insulation between source and drain potential a correspondingly thick field plate insulator 7 (e.g. oxide, protection nitride, photo imide, or the like) may be provided, which may possibly project beyond the metallization 6.

In order to be able to reliably contact each chip during the electrochemical etch process the wafer 1 may be placed with its front side 1a onto a contact plate or carrier 50 according to various embodiments. The contact plate 50 may include, e.g. consist of, a thin metallic contact foil 8 and an elastomer 9 that may deform, together with the foil 8, such that the source pads of each chip may be touched (contacted) by the foil 8. This arrangement may be disposed on a rigid or bend-proof base or holder 10. The force used for deformation of the elastomer 9 may be provided by, e.g., atmospheric pressure (indicated by arrows 11 in FIG. 5) and a pre-vacuum.

In order to connect the p-doped substrate 4, a highly conductive sacrificial layer 12 may be disposed on the wafer back side 1b. The sacrificial layer 12 may be etched away at the beginning of the pn etching, and, in the course of the etching 13, may remain only outside the sealing 15, where it may be contacted by means of a spring 14a. The arrangement may further include one or more lead-throughs of the electrical contacts to the outside, as well as one or more vacuum channels (not shown in the figures).

In one or more embodiments, for example in case of an IGBT, contacting the p-type substrate may make it possible that the p charge, which will come to a halt in the moment of the etch stop when the space charge zones meet, may be actively set by the negative p-bias. A fine tuning of the base material doping and the applied voltage may make a "cold" IGBT possible, in which the back side emitter is included automatically and may nevertheless be tuned. Thus, it may be possible to finish the IGBT without additional p-type dopant (e.g. boron) implantation and subsequent annealing process, e.g. laser annealing process.

In one or more embodiments, contacting devices and/or arrangements described herein in connection with electrochemical etching may alternatively or additionally be used for electrolytic deposition.

For example, in one or more embodiments, an integrative implementation of drain rings on power semiconductors may allow for electrolytic metallization directly after the etching, without having to take the wafer out of the holding device or holder. A contact via the sources (e.g. source pads) may not be sufficient in this case since the pn junction would be biased wrongly (in other words, with incorrect polarity). According to one or more embodiments, a carrier (e.g. glass carrier) may thus be saved if a back side metal manufactured in this way is produced with sufficient thickness.

In one or more embodiments, devices and/or methods described herein may be applied to manufacture, e.g., membranes that may be used, e.g., in sensors, e.g. acceleration sensors or pressure sensors, e.g. tire pressure sensors. In one or more embodiments, the number of chips (e.g. sensor chips, e.g. pressure sensor chips) per wafer may be increased. In one or more embodiments, the number of processes used for fabricating the chips may be reduced. In one or more embodiments, conductive tracks (interconnects) conventionally used for contacting the p and n regions at the wafer front side may be omitted. As an effect, unusable wafer area at the edge of the wafer may, for example, be reduced. As another effect, the voltage at the wafer front side may be distributed more homogeneously over the wafer since the non-negligible current flow of, e.g., 70 mA at the moment of the etch stop may no longer need to flow via the narrow conductive tracks.

Contacting devices and methods in accordance with one or more embodiments described herein may allow for the use of only one holder system for at least two different types of devices or products, for example for both an IGBT device and a pressure sensor (e.g. tire pressure sensor) device. The only changes that may possibly need to be made to adapt the contacting device/methods to the different devices or products may be changes in the software. In other words, one and the same holder system may be applied for the processing of different devices or products, for example for the processing of an IGBT device as well as the processing of a pressure sensor device, and possibly for the processing of other devices or products.

A holder system according to one or more embodiments described herein may be universally applicable for products, which may need to be thinned using an electrochemical etch stop (ECES), without having to spend particular effort on the layout with respect to the contacting.

FIG. 2 also illustrates the basic mode of operation of a pn etching process that may be used in accordance with one or more embodiments described herein.

Similarly as in the four-electrode arrangement for manufacturing the membranes of pressure and acceleration sensors, the p-substrate 104 to be etched may be negatively biased compared to the active semiconductor (e.g. silicon) for the devices. Thus, as shown in FIG. 2, two pn-junctions in the parasitic thyristor are biased in reverse direction (namely, the pn junction formed between the substrate 104 and the drift zone 103 and the pn junction formed between the substrate 104 and the electrolyte 105), so that, contrary to the situation shown in FIG. 1, the thyristor in FIG. 2 generally cannot switch through before the breakthrough voltage of one of the two pn-junctions is reached or the two space charge zones 134 and 145 meet.

Figure 6:
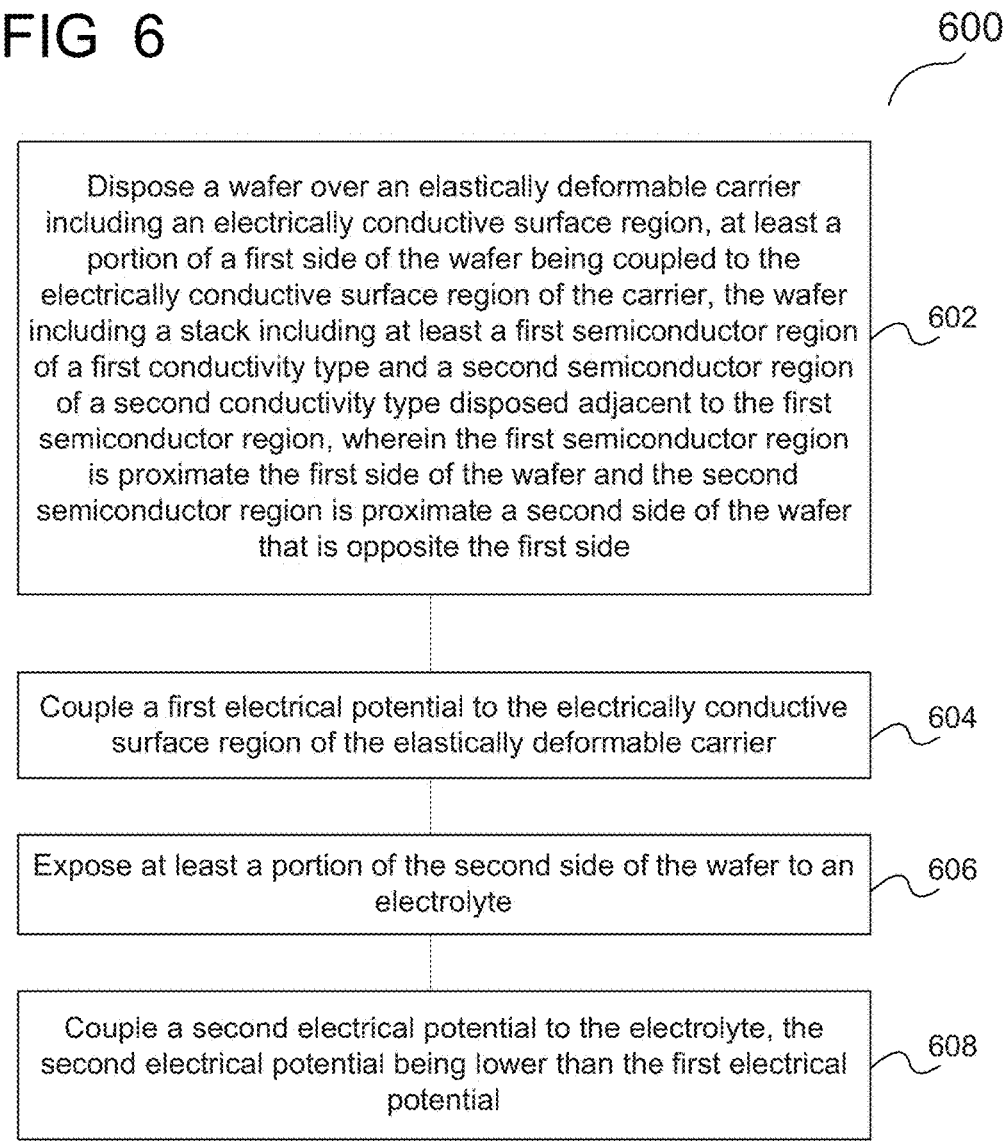
FIG. 6 shows a method for electrochemical etching of a wafer according to various embodiments.

FIG. 6 shows a method 600 for electrochemical etching of a wafer according to various embodiments.

Method 600 may include disposing a wafer over an elastically deformable carrier including an electrically conductive surface region, at least a portion of a first side of the wafer being coupled to the electrically conductive surface region of the carrier, the wafer including a stack including at least a first semiconductor region of a first conductivity type and a second semiconductor region of a second conductivity type disposed adjacent to the first semiconductor region, wherein the first semiconductor region is proximate the first side of the wafer and the second semiconductor region is proximate a second side of the wafer that is opposite the first side (in 602).

Method 600 may further include coupling a first electrical potential to the electrically conductive surface region of the elastically deformable carrier (in 604).

Method 600 may further include exposing at least a portion of the second side of the wafer to an electrolyte (in 606).

Method 600 may further include coupling a second electrical potential to the electrolyte, wherein the second electrical potential is lower than the first electrical potential (in 608)

In one or more embodiments, exposing at least a portion of the second side of the wafer to an electrolyte may include exposing a first portion of the second side of the wafer to the electrolyte, and method 600 may further include: coupling a third electrical potential to a second portion of the second side of the wafer that is not exposed to the electrolyte, wherein the third electrical potential is lower than the second electrical potential.

In one or more embodiments, the first conductivity type may be an n-type conductivity type and the second conductivity type may be a p-type conductivity type.

In one or more embodiments, the wafer may further include at least one third semiconductor region of the second conductivity type disposed at the first side of the wafer at least partially within the first semiconductor region, wherein the at least one third semiconductor region is coupled to the electrically conductive surface region of the elastically deformable carrier.

In one or more embodiments, the at least one third semiconductor region may include at least one semiconductor device cell structure, e.g. at least one transistor cell structure.

In one or more embodiments, the wafer may further include at least one metallization region (e.g. pad) disposed over a side of the at least one third semiconductor region, wherein the at least one metallization region is coupled to the electrically conductive surface region of the elastically deformable carrier.

In one or more embodiments, the elastically deformable carrier may include an electrically insulating base region (e.g. containing or being made of an elastomer), and a metallic foil disposed over the base region.

Method 600, or at least parts thereof, may further be configured in accordance with one or more embodiments described herein.

FIG. 7 shows a method 700 for electrochemical etching of a wafer according to various embodiments.

Method 700 may include providing a wafer having a first side and a second side opposite the first side, the wafer including a stack including at least a first semiconductor region of a first conductivity type and a second semiconductor region of a second conductivity type disposed adjacent to the first semiconductor region, wherein the first semiconductor region is proximate the first side and the second semiconductor region is proximate the second side of the wafer, wherein the first and second semiconductor regions include at least one power semiconductor device (in 702).

Method 700 may further include exposing a first portion of the second side of the wafer to an electrolyte (in 704). The electrolyte may, e.g., be configured in accordance with one or more embodiments described herein. Exposing the first portion of the second side to the electrolyte may, e.g., be carried out using an arrangement for electrochemical etching of a wafer according to one or more embodiments described herein.

Method 700 may further include coupling a first electrical potential to the first side of the wafer (in 706). The first electrical potential may, e.g., be configured in accordance with one or more embodiments described herein. Coupling the first electrical potential to the first side of the wafer may, e.g., be carried out using an arrangement for electrochemical etching of a wafer according to one or more embodiments described herein, e.g. using a wafer contacting device according to one or more embodiments described herein.

Method 700 may further include coupling a second electrical potential to the electrolyte (in 708). The second electrical potential may, e.g., be configured in accordance with one or more embodiments described herein. Coupling the second electrical potential to the electrolyte may, e.g., be carried out using an arrangement for electrochemical etching of a wafer according to one or more embodiments described herein, e.g. using a wafer contacting device according to one or more embodiments described herein.

Method 700 may further include coupling a third electrical potential to a second portion of the second side that is not exposed to the electrolyte, wherein the third electrical potential is lower than the second electrical potential and the second electrical potential is lower than the first electrical potential (in 710). The third electrical potential may, e.g., be configured in accordance with one or more embodiments described herein. Coupling the third electrical potential to the second portion of the second side may, e.g., be carried out using an arrangement for electrochemical etching of a wafer according to one or more embodiments described herein, e.g. using a wafer contacting device according to one or more embodiments described herein.

Method 700, or at least parts thereof, may further be configured in accordance with one or more embodiments described herein.

For example, in one or more embodiments, the first conductivity type may be an n-type conductivity type and the second conductivity type may be a p-type conductivity type.

For example, in one or more embodiments, the wafer may further include at least one third semiconductor region of the second conductivity type disposed at the first side of the wafer at least partially within the first semiconductor region, and coupling the first electrical potential to the first side may include coupling the first electrical potential to the at least one third semiconductor region.

For example, in one or more embodiments, the at least one third semiconductor region may include at least one semiconductor device cell structure, e.g. at least one transistor cell structure.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:
1. A wafer contacting device, comprising:
a receiving region configured to receive a wafer;
an elastically deformable carrier disposed in the receiving region and comprising an electrically conductive surface region; and
a retainer configured to retain the wafer in the receiving region,
wherein the electrically conductive surface region of the carrier is configured to electrically contact a first side of the wafer, and wherein the retainer comprises a contacting structure configured to electrically contact a second side of the wafer that is opposite the first side.

2. The wafer contacting device of claim 1, wherein the elastically deformable carrier comprises an electrically insulating base region, wherein the electrically conductive surface region is disposed over the base region.

3. The wafer contacting device of claim 2, wherein the electrically insulating base region comprises an elastically deformable plastic material.

4. The wafer contacting device of claim 1, wherein the electrically conductive surface region comprises a metallic foil.

5. The wafer contacting device of claim 1, further comprising a holder, the holder comprising the receiving region.

6. The wafer contacting device of claim 5, wherein the retainer is configured to be placed over the holder
wherein the contacting structure of the retainer electrically contacts the second side of the wafer at a boundary region of the wafer.

7. The wafer contacting device of claim 6, further comprising at least one voltage source configured to apply a first electrical potential to the electrically conductive surface region, to apply a second electrical potential to an electrolyte to be brought into contact with at least a portion of the back side of the wafer, and to apply a third electrical potential to the contacting structure.

8. The wafer contacting device of claim 1, further comprising a voltage source electrically coupled to the electrically conductive surface region of the carrier.

9. The wafer contacting device of claim 1, wherein the contacting structure is configured to electrically contact the second side of the wafer at a boundary region of the wafer.

10. The wafer contacting device of claim 1, wherein the retainer further comprises a sealing configured to seal the boundary region and the contacting structure against an electrolyte.

11. The wafer contacting device of claim 1, wherein the contacting structure comprises at least one spring.

12. An arrangement for electrochemical etching of a wafer, comprising:
a wafer contacting device, comprising:
a holder comprising a receiving region configured to receive a wafer;
an elastically deformable carrier disposed in the receiving region and comprising an electrically conductive surface region; and
a retainer placed over the holder, wherein the retainer comprises a contacting structure, which is in electrical contact with a second side of the wafer at a boundary region of the wafer
wherein the wafer is disposed over the elastically deformable carrier in the receiving region and retained by the retainer, wherein the electrically conductive surface region is in contact with at least a portion of a first side of the wafer;
an electrolyte in contact with at least a portion of the second side of the wafer opposite the first side
at least one voltage source coupled to the electrically conductive surface region of the carrier and to the electrolyte, and configured to apply a first electrical potential to the electrically conductive surface region and to apply a second electrical potential to the electrolyte.

13. The arrangement of claim 12, wherein the wafer comprises a stack comprising at least a first semiconductor region of a first conductivity type and a second semiconductor region of a second conductivity type disposed adjacent to the first semiconductor region, wherein the first semiconductor region is proximate the first side of the wafer and the second semiconductor region is proximate the second side of the wafer.

14. The arrangement of claim 13, wherein the first conductivity type is an n-type conductivity type and the second conductivity type is a p-type conductivity type, and
wherein the second electrical potential is lower than the first electrical potential.

15. The arrangement of claim 14,
wherein the electrolyte is in contact with the second side of the wafer except at the boundary region;
wherein the at least one voltage source is further coupled to the contacting structure and configured to apply a third electrical potential to the contacting structure;
wherein the third electrical potential is lower than the second electrical potential.

16. The arrangement of claim 13, wherein the wafer further comprises at least one third semiconductor region of the second conductivity type disposed at the first side of the wafer at least partially within the first semiconductor region.

17. The arrangement of claim 16, wherein the wafer further comprises at least one metallization region disposed over a side of the at least one third semiconductor region facing the elastically deformable carrier.

18. The arrangement of claim 17, wherein the wafer further comprises at least one insulating region disposed laterally adjacent to the at least one metallization region.

19. The arrangement of claim 18, wherein the at least one insulating region protrudes from the first side of the wafer.

20. The arrangement of claim 12, wherein the first side of the wafer is a front side of the wafer, and wherein the second side of the wafer is a back side of the wafer.

21. A method for electrochemical etching of a wafer, comprising:
disposing a wafer over an elastically deformable carrier comprising an electrically conductive surface region, at least a portion of a first side of the wafer being coupled to the electrically conductive surface region of the carrier, the wafer comprising a stack comprising at least a first semiconductor region of a first conductivity type and a second semiconductor region of a second conductivity type disposed adjacent to the first semiconductor region, wherein the first semiconductor region is proximate the first side of the wafer and the second semiconductor region is proximate a second side of the wafer that is opposite the first side;
disposing a retainer to retain the wafer, wherein the retainer comprises a contacting structure configured to electrically contact the second side of the wafer;
coupling a first electrical potential to the electrically conductive surface region of the elastically deformable carrier;
exposing at least a portion of the second side of the wafer to an electrolyte; and
coupling a second electrical potential to the electrolyte, wherein the second electrical potential is lower than the first electrical potential.

22. The method of claim 21, wherein exposing at least a portion of the second side of the wafer to an electrolyte comprises exposing a first portion of the second side of the wafer to the electrolyte, and wherein the method further comprises:
coupling a third electrical potential to a second portion of the second side of the wafer that is not exposed to the electrolyte;

wherein the third electrical potential is lower than the second electrical potential.

\* \* \* \* \*

UNITED STATES PATENT AND TRADEMARK OFFICE
CERTIFICATE OF CORRECTION

PATENT NO. : 10,373,839 B2
APPLICATION NO. : 14/023577
DATED : August 6, 2019
INVENTOR(S) : Kroener et al.

Page 1 of 1

It is certified that error appears in the above-identified patent and that said Letters Patent is hereby corrected as shown below:

In the Claims

Column 19, Line 58, Claim 12: Please insert --;-- at the end of the line.

Signed and Sealed this
Twenty-sixth Day of November, 2019

Andrei Iancu
*Director of the United States Patent and Trademark Office*